July 11, 1967 H. BANASIEWICZ ET AL 3,331,029
A.C. TRANSISTOR AMPLIFIERS FOR D.C. BIAS CONTROLLED STABILIZATION
Filed Nov. 13, 1963
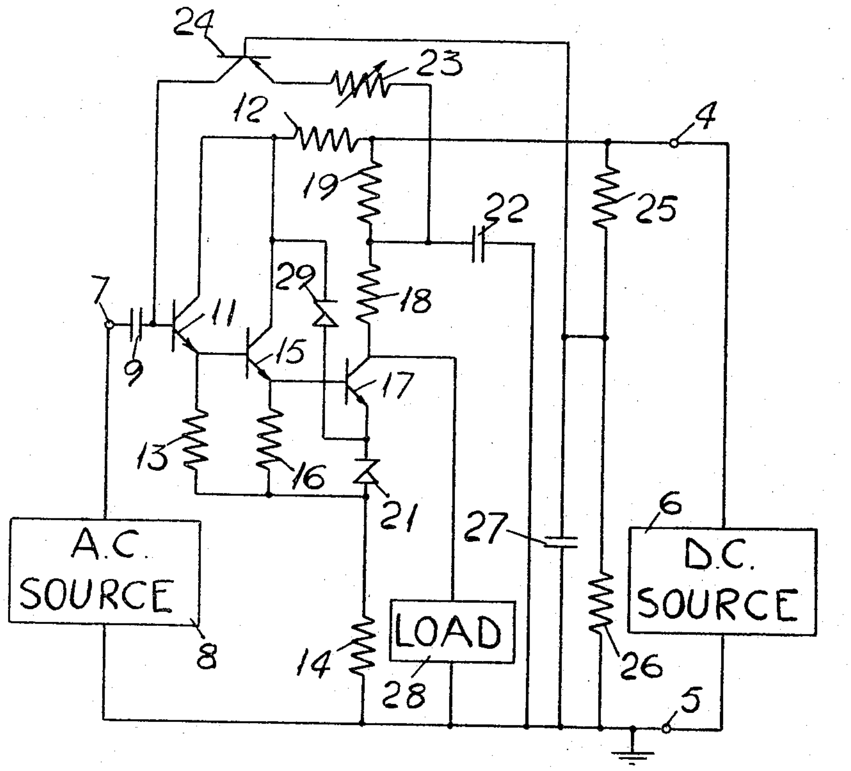

United States Patent Office 3,331,029
Patented July 11, 1967

3,331,029

A.C. TRANSISTOR AMPLIFIERS FOR D.C. BIAS CONTROLLED STABILIZATION

Henryk Banasiewicz, London, and Alan Fern, Watford, England, assignors to Joseph Lucas (Industries) Limited, Birmingham, England Filed Nov. 13, 1963, Ser. No. 323,374
2 Claims. (Cl. 330—25)

This invention relates to A.C. amplifiers of the kind including an input transistor to the base of which the A.C. signal to be amplified is applied, an output transistor, a resistor common to the emitter circuits of the input and output transistors, at least one further transistor connected as an emitter follower between the input and output transisors, and means for providing base current to said input transistor without significantly lowering the input impedance of the amplifier.

According to the invention, in an A.C. amplifier of the kind specified, said base current is provided through the emitter and collector of a grounded-base transistor.

The accompanying drawing is a circuit diagram illustrating one example of the invention.

Referring to the drawings there are provided first and second terminals 4, 5 which in use are connected to a D.C. source 6, and an input terminal 7 for connection to the source 8 of A.C. to be amplified. Conveniently, the terminal 5 is earthed. The terminal 7 is connected through a capacitor 9 to the base of an n-p-n transistor 11 having its collector connected to the terminal 4 through a resistor 12 and its emitter connected to the terminal 5 through resistors 13, 14 in series. The emitter is further connected to the base of a second n-p-n transistor 15 having its collector connected to the terminal 4 through the resistor 12 and its emitter connected to the terminal 5 through a resistor 16 and the resistor 14 in series. The emitter of the transistor 15 is also connected to the base of a third n-p-n transistor 17 having its collector connected to the terminal 4 through resistors 18, 19 in series, and its emitter connected to the terminal 5 through the cathode and anode of a Zener diode 21 and the resistor 14 in series.

A point intermediate the fourth and fifth resistors 18, 19 is decoupled through a capacitor 22, and is further connected through a variable resistor 23 to the emitter of a p-n-p transistor 24 having its collector connected to the base of the transistor 11. The base of the transistor 24 is connected to the terminal 4 through a resistor 25, and to the terminal 5 through a resistor 26 and a capacitor 27 in parallel. The output to a load 28 is taken between the collector of the transistor 17 and the terminal 5.

In operation, the transistors 11, 15 act as emitter followers and the transistor 17 as an amplifier to provide an amplified A.C. signal, the emitter-follower configuration of the transistors ensuring that the input impedance of the amplifier is high. The D.C. negative feedback via the transistor 24 provides D.C. stabilisation against temperature and ageing effects, but since the transistor 24 has its base grounded, its emitter-collector impedance is high, and so the input impedance of the amplifier remains high. The resistor 23 enables an initial adjustment of the feedback to be made.

If desired, additional A.C. feedback may be provided through a Zener diode 29 having its anode connected to the emitter of the transistor 17 and its cathode connected to the collectors of the transistors 11, 15.

Having thus described our invention what we claim as new and desire to secure by Letters Patent is:

1. An A.C. amplifier including an input transistor and an output transistor and a further transistor connected as an emitter follower for providing an A.C. coupling between the input and output transistors, the A.C. signal to be amplified being applied to the base of the input transistor, a resistor common to the emitter circuits of the three transistors, a pair of resistors in the collector circuit of said output transistor, a capacitor grounding a point intermediate said pair of resistors, and a feedback transistor for supplying base current to said input transistor, means connecting the emitter collector circuit of said feedback transistor between the base of said input transistor and said point and a further capacitor through which the base of said feedback transistor is earthed.

2. An amplifier as claimed in claim 1 including a variable resistor in the collector emitter circuit of said feedback transistor.

References Cited

UNITED STATES PATENTS

| | | | |
|---|---|---|---|
| 2,903,522 | 9/1959 | Flower | 330—28 |
| 3,075,515 | 1/1963 | Murray | 330—28 X |
| 3,106,684 | 10/1963 | Luik | 330—26 X |

ROY LAKE, *Primary Examiner.*

NATHAN KAUFMAN, *Examiner.*